United States Patent
Shirakami et al.

(10) Patent No.: US 7,663,883 B2
(45) Date of Patent: Feb. 16, 2010

(54) HEAT TRANSFER MECHANISM, HEAT DISSIPATION SYSTEM, AND COMMUNICATION APPARATUS

(75) Inventors: Takashi Shirakami, Kawasaki (JP); Naoya Yamazaki, Kawasaki (JP); Kazuhiro Iino, Kawasaki (JP); Yoshiaki Tada, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 156 days.

(21) Appl. No.: 10/871,675

(22) Filed: Jun. 18, 2004

(65) Prior Publication Data
US 2005/0180113 A1  Aug. 18, 2005

(30) Foreign Application Priority Data
Feb. 13, 2004 (JP) .............................. 2004-036815

(51) Int. Cl.
*H05K 7/20* (2006.01)

(52) U.S. Cl. ................. 361/700; 361/699; 361/704; 361/719; 257/714; 257/715; 174/15.2; 165/80.3; 165/80.4; 165/104.26

(58) Field of Classification Search ......... 361/699–704; 165/80.4–80.5, 104.33, 185; 174/15.2
See application file for complete search history.

(56) References Cited

U.S. PATENT DOCUMENTS

| | | | |
|---|---|---|---|
| 4,996,589 A | | 2/1991 | Kajiwara et al. |
| 5,343,940 A | * | 9/1994 | Jean ................ 165/104.33 |
| 5,694,295 A | * | 12/1997 | Mochizuki et al. ...... 361/699 |
| 5,969,940 A | * | 10/1999 | Sano et al. ............ 361/679.52 |
| 5,991,155 A | * | 11/1999 | Kobayashi et al. ......... 361/705 |
| 6,025,991 A | * | 2/2000 | Saito ...................... 361/704 |
| 6,097,598 A | * | 8/2000 | Miyahara et al. ........... 361/704 |
| 6,163,073 A | * | 12/2000 | Patel ....................... 257/712 |
| 6,257,328 B1 | * | 7/2001 | Fujiwara et al. ............ 165/185 |
| 6,446,706 B1 | * | 9/2002 | Rosenfeld et al. ........... 165/46 |
| 6,529,377 B1 | * | 3/2003 | Nelson et al. .............. 361/699 |
| 6,585,039 B2 | * | 7/2003 | Sagal et al. ................ 165/185 |
| 6,651,732 B2 | * | 11/2003 | Sagal ...................... 165/80.3 |
| 6,728,104 B1 | * | 4/2004 | Ahmad et al. ............. 361/704 |
| 6,765,798 B1 | * | 7/2004 | Ratliff et al. .............. 361/704 |
| 6,771,495 B2 | * | 8/2004 | Fujiwara et al. ............ 361/685 |

(Continued)

FOREIGN PATENT DOCUMENTS

JP 1-107564 4/1989

(Continued)

OTHER PUBLICATIONS

Notice of Reasons for Rejection dated Feb. 17, 2009, from the corresponding Japanese Application.

(Continued)

*Primary Examiner*—Boris L Chervinsky
(74) *Attorney, Agent, or Firm*—Katten Muchin Rosenman LLP

(57) ABSTRACT

A heat transfer mechanism for dissipating heat from a heat generating body to a heat dissipating part, realizing both a high elasticity and a high thermal conductivity, comprised of a film-shaped heat conductor for transferring heat to the heat dissipating part and an elastic member for imparting elasticity to the film-shaped heat conductor, the film-shaped heat conductor being formed from metal foil-type flexible heat pipes or carbon-based thermal conductive sheets.

6 Claims, 19 Drawing Sheets

U.S. PATENT DOCUMENTS

| | | | |
|---|---|---|---|
| 6,914,780 B1 * | 7/2005 | Shanker et al. | 361/687 |
| 2004/0032710 A1 | 2/2004 | Fujiwara et al. | |
| 2004/0069460 A1 | 4/2004 | Sasaki et al. | |
| 2004/0265489 A1 * | 12/2004 | Dubin | 427/212 |

FOREIGN PATENT DOCUMENTS

| | | |
|---|---|---|
| JP | 2-54064 | 4/1990 |
| JP | 5-66095 | 3/1993 |
| JP | 5-315480 | 11/1993 |
| JP | 7-245362 | 9/1995 |
| JP | 10-242354 | 9/1998 |
| JP | 10-294407 | 11/1998 |
| JP | 10-294580 | 11/1998 |
| JP | 2002-352575 | 12/2002 |
| JP | 2003-69263 | 3/2003 |
| JP | 2004-28557 | 1/2004 |

OTHER PUBLICATIONS

Notice of Reasons for Rejection dated Jun. 4, 2009, from the corresponding Japanese Application.

* cited by examiner

HEAT TRANSFER MECHANISM, HEAT DISSIPATION SYSTEM, AND COMMUNICATION APPARATUS

BACKGROUND OF THE INVENTION

1. Field of the Invention

The present invention relates to a heat transfer mechanism for dissipating heat generated from a heat generating body and a heat dissipation system and communication apparatus using that heat transfer mechanism.

2. Description of the Related Art

In the recent electrical equipment market, the power consumed by each of the many electrical components making up electrical equipment has become greater. At the same time as time, demands for miniaturization of such electrical equipment have led to higher mounting densities of the many electrical components making up the electrical equipment.

To enable this higher power consumption and higher mounting density, several challenges remain to be overcome in the heat transfer mechanisms of the related art. Typical examples of these challenges are as follows:

i) A heat dissipating structure enabling a plurality of heat generating bodies generating high heat to be mounted at a high density ii) High efficiency cooling of even a superhigh temperature heat generating body generating heat far exceeding for example 100° C.

iii) High efficiency cooling of all heat generating bodies mounted at a high density at the same time while absorbing variations in tolerances of shapes of the heat generating bodies iv) High enough of a thermal conductivity to dissipate heat generated from a plurality of heat generating bodies by an efficiency higher than a common heat dissipating part v) A structure enabling heat dissipation without applying any excessive external stress on any of a plurality of heat generating bodies Here, a look at the related art shows that various heat transfer mechanisms have been proposed up until now. For example, there are Related Art A and Related Art B. Further, the Related Arts C, D, E, and F disclosed in Japanese Unexamined Patent Publication (Kokai) NOs. 5-315480, 1-17564, 10-294580, and 5-66-95 are known. None of these Related Arts A to F (see FIGS. 20 to 25) simultaneously overcomes all of the above challenges i) to v). This will be explained in detail later while referring to the drawings.

SUMMARY OF THE INVENTION

In view of the problems of the Related Arts A to F (explained later in detail with reference to FIG. 20 to FIG. 25), an object of the present invention is to provide a heat transfer mechanism able to realize both a high elasticity and a high thermal conductivity, even in a narrow space, simply, compactly, and at a low cost.

Another object is to provide a heat dissipation system and communication apparatus using this heat transfer mechanism.

To attain the above object, according to the present invention, there is provided a heat transfer mechanism for dissipating heat from a heat generating body from a heat dissipating part, comprised of a film-shaped heat conductor for transferring heat to the heat dissipating part and an elastic member for imparting elasticity to the film-shaped heat conductor. Here, the film-shaped heat conductor is formed from a metal foil-type flexible heat pipe or carbon-based thermal conductive sheet.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Before describing the embodiments of the present invention, the related art and the disadvantages therein will be described with reference to the related figures.

Figure 20:
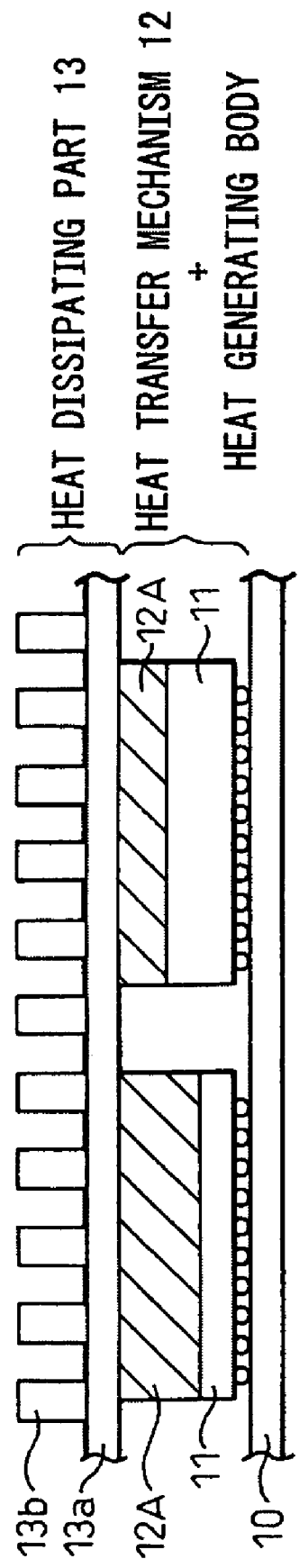
FIG. 20 is a cross-sectional view of a Related Art A.

FIG. 20 is a cross-sectional view of the Related Art A. In the figure, the parts of the heat transfer mechanism 12 particularly relevant to the present invention are shown by hatching.

According to the illustrated example, a board 10 (printed circuit board) 10 mounts two heat generating bodies 11 (for example, IC packages) of different sizes. The heat generated from these heat generating bodies 11 is dissipated through this heat transfer mechanism 12 to a heat dissipating part 13, whereby the heat generating bodies 11 are cooled. Note that according to the illustrated example, the heat dissipating part 13 is comprised of a heat diffusion plate 13a and heat dissipating fins 13b formed integrally with it.

Now, according to the illustrated Related Art A, the heat transfer mechanism 12 concerned is comprised of rubber thermal conductive sheets 12A. The specific composition of the rubber thermal conductive sheets 12A is silicone rubber. As is well known, silicone rubber has a high thermal conductivity (1 to 2 W/° C.·m if soft type and 10 W/° C.·m if hard type), but is a rubber, so also is provided with elasticity.

Accordingly, the above-mentioned challenges i) to v) can be overcome to a certain extent. However, this is insufficient for dealing with the much higher power consumption and higher mounting density expected in the future. The reason is that with such a narrow space, achievement of both high elasticity and high thermal conductivity is considerably difficult.

That is, if utilizing for example the known technique of blending in metal fibers so as to realize a greater improvement of the thermal conductivity (higher thermal conductivity), the elasticity as a rubber will end up being lost (lower elasticity). Further, if trying to raise the thermal conductivity of silicone rubber without blending in metal fibers, generally the hardness of the silicone rubber will proportionally become higher.

In the final analysis, both the high elasticity and high thermal conductivity for overcoming the above challenges i) to v) cannot be sufficiently achieved by the rubber thermal conductive sheets 12A.

Figure 21:
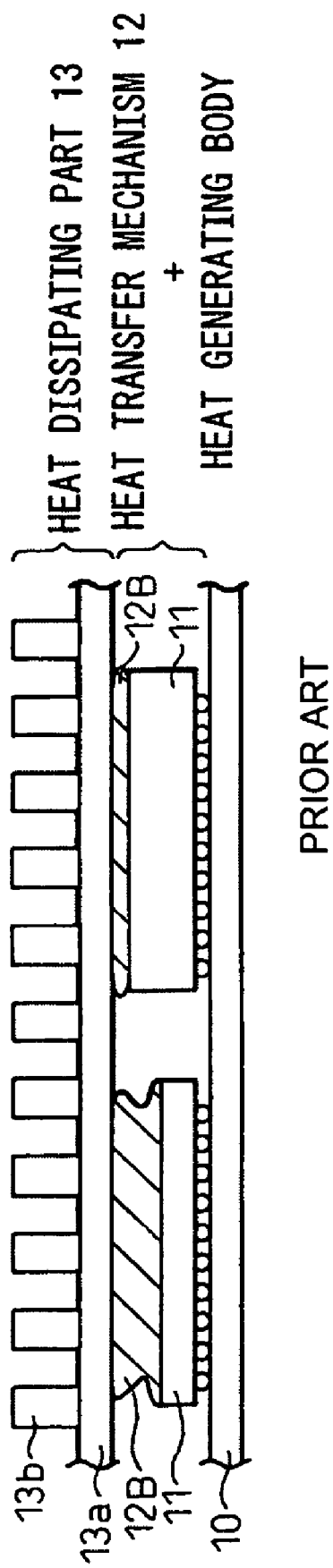
FIG. 21 is a cross-sectional view of a Related Art B.

Next, let us look at the Related Art B. FIG. 21 is a cross-sectional view showing the Related Art B. Note that throughout the figures, similar components are assigned the same reference numerals or symbols.

According to the illustrated Related Art B, the heat transfer mechanism 12 concerned is comprised of a compound 12B. The specific configuration of the compound 12B is a silicone-based grease.

This silicone-based grease has the advantage that it can be sufficiently used even in a considerably narrow space, but is not inherently provided with the property of high elasticity. Further, if blending in the above-mentioned metal fibers to improve the thermal conductivity, the grease ends up becoming clay like and air, which is a poor heat conductor, is liable to become entrained. Still further, in the process of assembly of the heat generating bodies 11 and the heat dissipating part 13, when a step of returning to the original state and reassembly after assembly once is required, the work efficiency will become extremely poor due to the gel-like or clay-like nature of the grease.

In the final analysis, both high elasticity and high thermal conductivity cannot be achieved by the Related Art B either.

Figure 22:
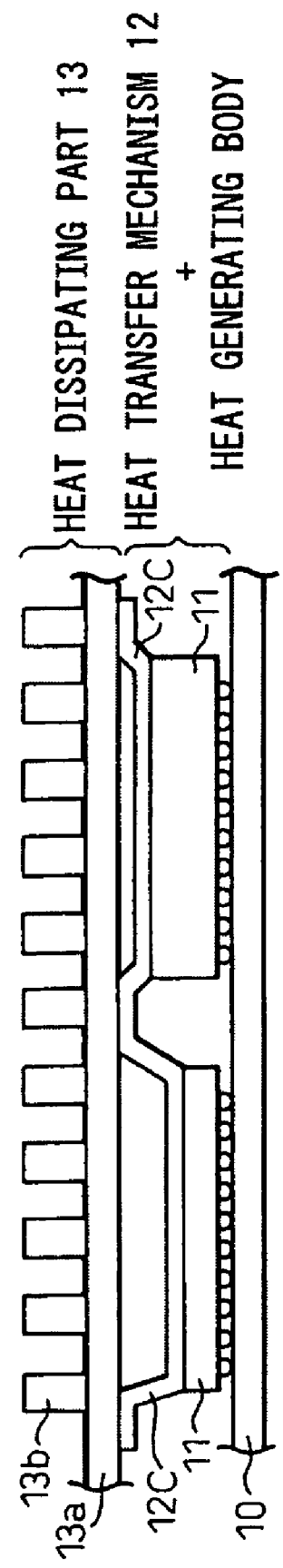
FIG. 22 is a cross-sectional view of a Related Art C.

Next, let us look at the Related Art C. FIG. 22 is a cross-sectional view showing the Related Art C.

According to the illustrated Related Art C Japanese Unexamined Patent Publication (Kokai) No. 5-315480), the heat transfer mechanism 12 concerned is comprised of a metal leaf spring 12C. The specific material of the metal leaf spring 12C is phosphor bronze.

This phosphor bronze leaf spring can exhibit its original superior elasticity in a narrow space, but if realization of a higher mounting density is required, it is sufficient to make the leaf spring thinner and raise the elasticity.

If making the leaf spring further thinner however, the thermal conductivity of the leaf spring itself ends up dropping sharply. Phosphor bronze, as is well known, has a relatively high thermal conductivity of for example 84 W/° C.·m, but the drop in thermal conductivity due to the reduced thickness becomes a large obstacle to the high thermal conductivity sought.

In the final analysis, both high elasticity and high thermal conductivity cannot be achieved by the Related Art C either.

Figure 23:
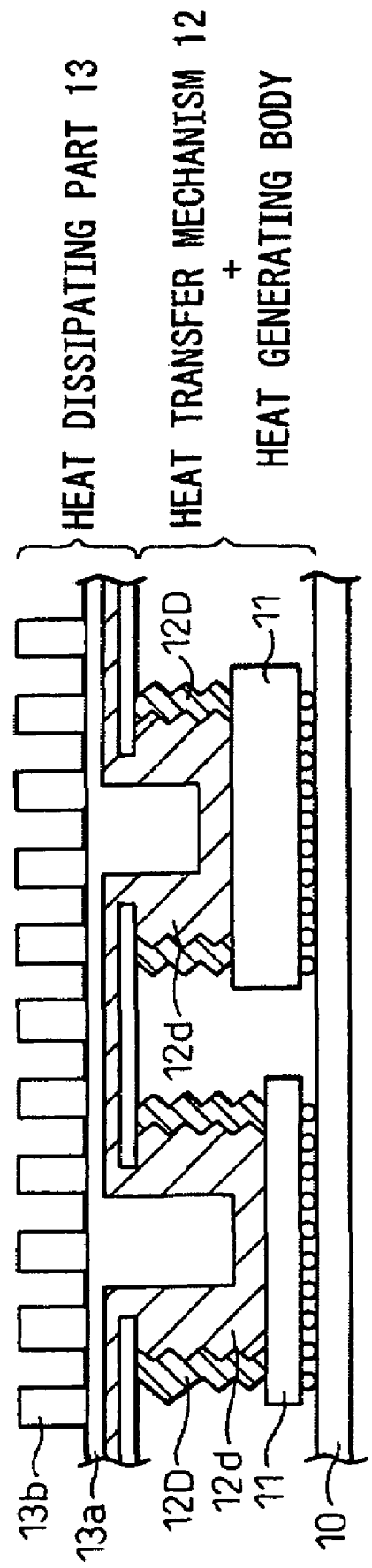
FIG. 23 is a cross-sectional view of a Related Art D.

Next, let us look at the Related Art D. FIG. 23 is a cross-sectional view showing the Related Art D.

According to the illustrated Related Art D (Japanese Unexamined Patent Publication (Kokai) No. 1-107564), the heat transfer mechanism 12 concerned is comprised of bellows 12D and a coolant 12d (for example, water) filled in them. The bellows 12D are for example made of a metal.

According to the heat transfer mechanism 12 of the Related Art D, the high elasticity due to the bellows 12D and the high thermal conductivity (heat dissipation) due to the coolant 12d filled in them can be simultaneously satisfied. This related art is superior on this point.

However, due to the large structure, this related art is inherently not suited for use in a narrow space and the cost becomes higher. Further, there is also the risk of trouble (short-circuits) due to leakage of the coolant (12d).

Figure 24:
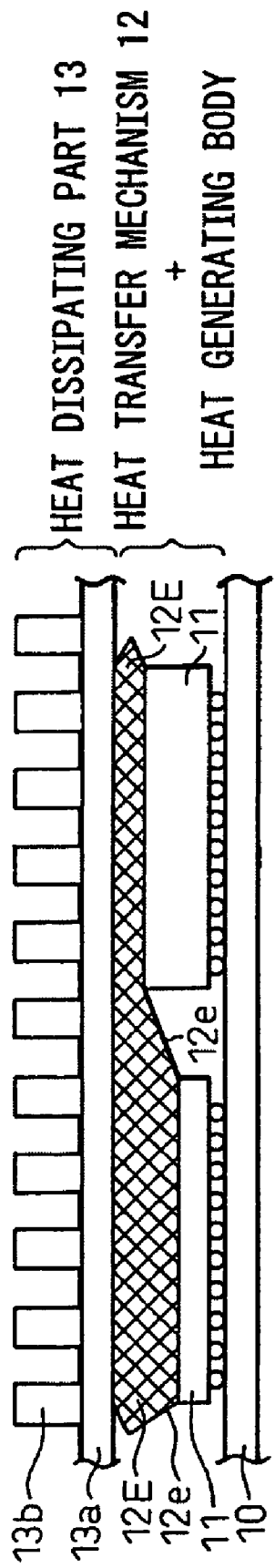
FIG. 24 is a cross-sectional view of a Related Art E.

Next, let us look at the Related Art E. FIG. 24 is a cross-sectional view showing the Related Art E.

According to the illustrated Related Art E (Japanese Unexamined Patent Publication (Kokai) No. 10-294580), the heat transfer mechanism 12 concerned is comprised of a metal mesh 12E and a thermal conductive sheet 12e surrounding it. Note that the main role of the thermal conductive sheet 12e is to prevent small pieces dropping off from the metal mesh 12E from short-circuiting interconnects of the printed circuit board 10.

According to this illustrated heat transfer mechanism 12, by employing this metal mesh 12E, the requirement of a high elasticity can be satisfied. A metal mesh 12E, however, inherently has entrained in it air, which is a poor conductor of heat, inside it, so cannot be said to be superior in terms of the thermal conductivity.

To raise this thermal conductivity, in general, it may be considered to make the mesh density greater. A metal mesh 12E with a greater mesh density, however, ends up losing its inherent high elasticity. Further, such a high mesh density metal mesh ends up losing almost all elasticity in a narrow space.

In the final analysis, both high elasticity and high thermal conductivity cannot be achieved by the Related Art E either.

Figure 25:
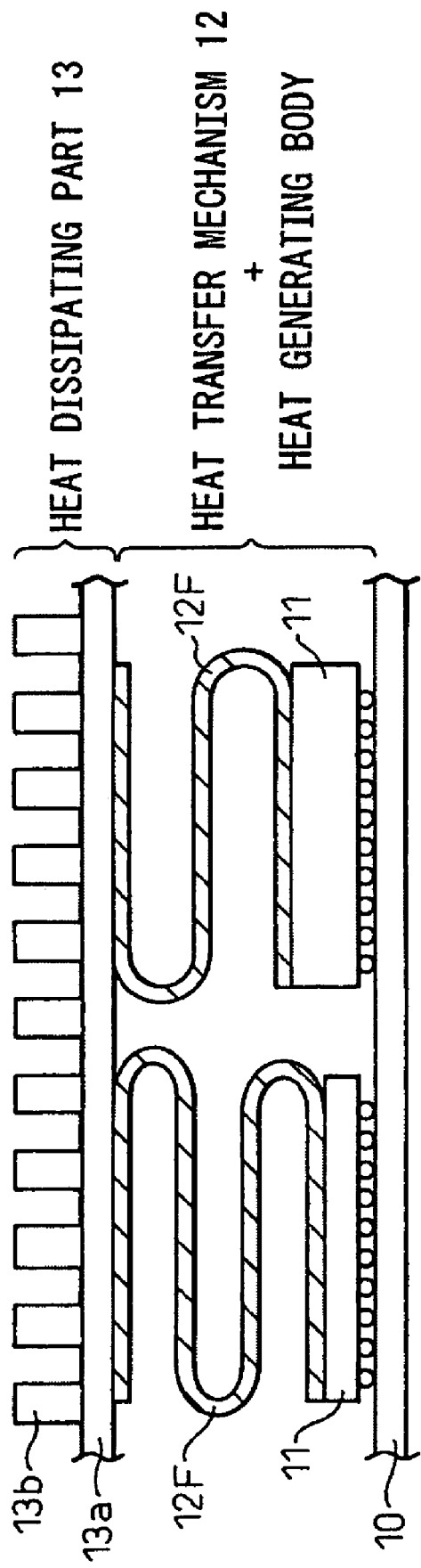
FIG. 25 is a cross-sectional view of a Related Art F.

Finally, let us look at the Related Art F. FIG. 25 is a cross-sectional view showing the Related Art F.

According to the illustrated Related Art F (Japanese Unexamined Patent Publication (Kokai) No. 5-66095), the heat transfer mechanism 12 concerned is comprised of plate-shaped heat pipes 12F. Note that in the figure, plate-shaped heat pipes 12F of an S+U shape (left) and an S-shape (right) are employed in accordance with the size of the space between the heat generating bodies 11 and the heat diffusion plate 13a.

Plate-shaped heat pipes have been long known as heat dissipating means made of hollow metal plates and have far superior heat transfer property than solid metal itself.

On the other hand, however, plate-shaped heat pipes are poor in elasticity. To make up for this poor elasticity, as illustrated, the pipes are made an S-shape or an (S+U) shape. Therefore, introduction of plate-shaped heat pipes in a narrow space of for example several mm becomes substantially impossible. Even if forming the plate-shaped heat pipes by phosphor bronze with great elasticity, it is extremely difficult to fit them into a narrow space of several mm.

In the final analysis, in this Related Art F, even if an extremely high thermal conductivity can be realized, realization of a high elasticity, in particular a high elasticity in a narrow space, is extremely difficult.

In view of the problems of the Related Arts A to F, the present invention provides a heat transfer mechanism able to realize both a high elasticity and a high thermal conductivity, even in a narrow space, simply, compactly, and at a low cost.

The present invention also provides a heat dissipation system and communication apparatus using this heat transfer mechanism.

Figure 1:
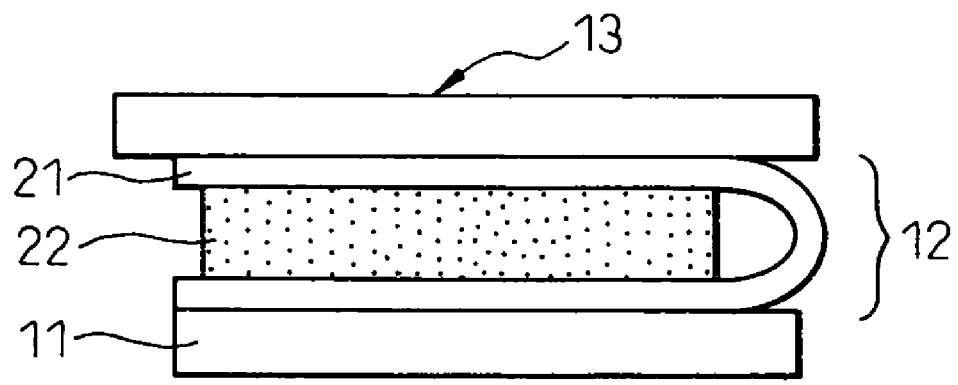
FIG. 1 is a view of a first basic configuration according to the present invention in cross-section.
Figure 2:
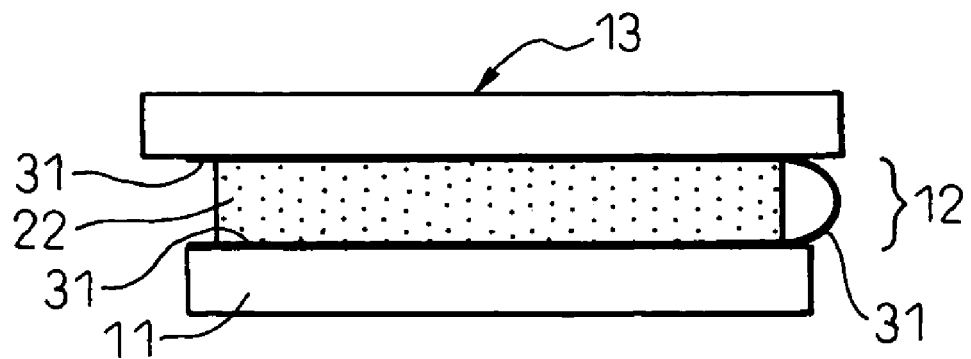
FIG. 2 is a view of a second basic configuration according to the present invention in cross-section.

FIG. 1 is a view of the first basic configuration based on the present invention in cross-section, while FIG. 2 is a view of a second basic configuration based on the present invention.

First, referring to FIG. 1 (first basic configuration), the illustrated heat transfer mechanism 12 is a heat transfer mechanism for dissipating heat from a heat generating body 11 to a heat dissipating part 13, comprised of a film-shaped heat conductor 21 for transferring heat from the heat generating body 11 to the heat dissipating part 13 and an elastic member 22 for imparting elasticity to the film-shaped heat conductor 21. Here, the film-shaped heat conductor 21 is formed from a metal foil-type flexible heat pipe. This metal foil-type flexible heat pipe is comprised of a hollow metal plate as shown in FIG. 25 and is fundamentally different from the typical plate-type heat pipe with almost no flexibility.

On the other hand, referring to FIG. 2, the illustrated heat transfer mechanism 12 also, like in FIG. 1, is a heat transfer mechanism which dissipates heat generated from a heat generating body 11 to a heat dissipating part 13 and is comprised of a film-shaped heat conductor 31 for transferring heat from the heat generating body 11 to the heat dissipating part 13 and an elastic member 22 for imparting elasticity to the film-shaped heat conductor 31. The film-shaped heat conductor 31 in FIG. 2, however, is formed from a carbon-based thermal conductive sheet.

As explained above, the heat transfer mechanism 12 in the present invention employs a film-shaped heat conductor (21, 31) able to exhibit a high thermal conductivity in a narrow space. This film-shaped heat conductor (21, 31) is provided with the ability to sufficiently transfer heat to the outside even in a narrow space, but has no shape recovery ability at all. Therefore, a means for imparting shape recovery to the film-shaped heat conductor (21, 31) is assembled with the film-shaped heat conductor.

The means for imparting shape recovery does not have to impart heat transferability and need only have the ability to impart elasticity to the film-shaped heat conductor (21, 31) superior in thermal conductivity, but having no elasticity at all. This is the above elastic member 22.

Therefore, according to the present invention, it is possible to realize a heat transfer mechanism achieving both a high elasticity and a high thermal conductivity in a narrow space and further a heat transfer mechanism (12) of a simple, compact, light weight structure and low cost.

FIRST EMBODIMENT

Figure 3:
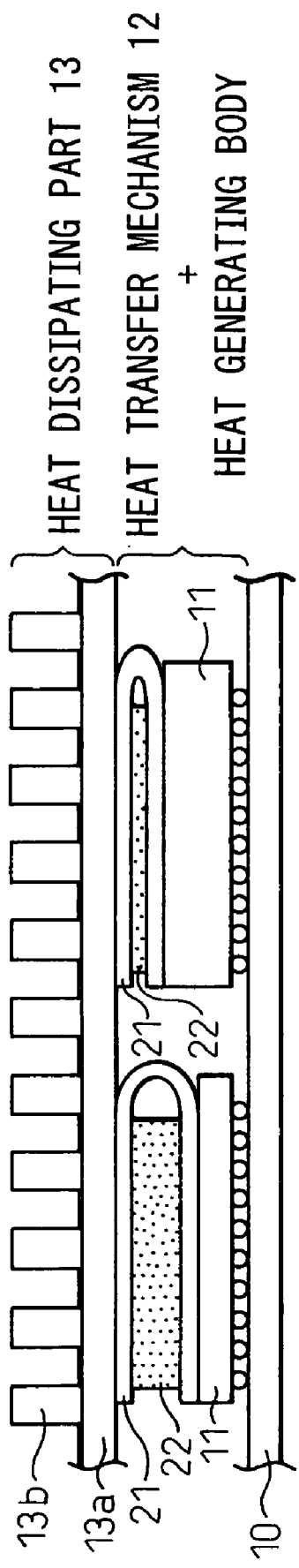
FIG. 3 is a view of a first embodiment according to the first basic configuration (FIG. 1) in cross-section.

FIG. 3 is a cross-sectional view of a first embodiment based on the first basic configuration (FIG. 1). In the figure, the components 10 to 13 are completely the same as the components explained in the related arts (FIG. 20 to FIG. 25). The board (printed circuit board) 10 mounts two heat generating bodies 11 (for example, IC packages) of different sizes. The heat generated from the heat generating bodies 11 is dissipated from the heat dissipating part 13 through the heat transfer mechanism 12. Due to this, the heat generating bodies 11 are cooled. Note that according to this illustrated example, the heat dissipating part 13 is comprised of a heat diffusion plate 13a and heat dissipating fins 13b formed integrally with the same.

The heat transfer mechanism 12 for transferring heat from the heat generating bodies 11 to the heat dissipating part 13, as shown in FIG. 1, is comprised of film-shaped heat conductors 21 and elastic members 22 joined with the same.

More specifically, each film-shaped heat conductor 21 is U-shaped in side cross-section and transfers heat from the corresponding heat generating body 11 to the heat dissipating part 13 along the U-shape. An elastic member 22 is inserted into this U-shape.

Figure 4:
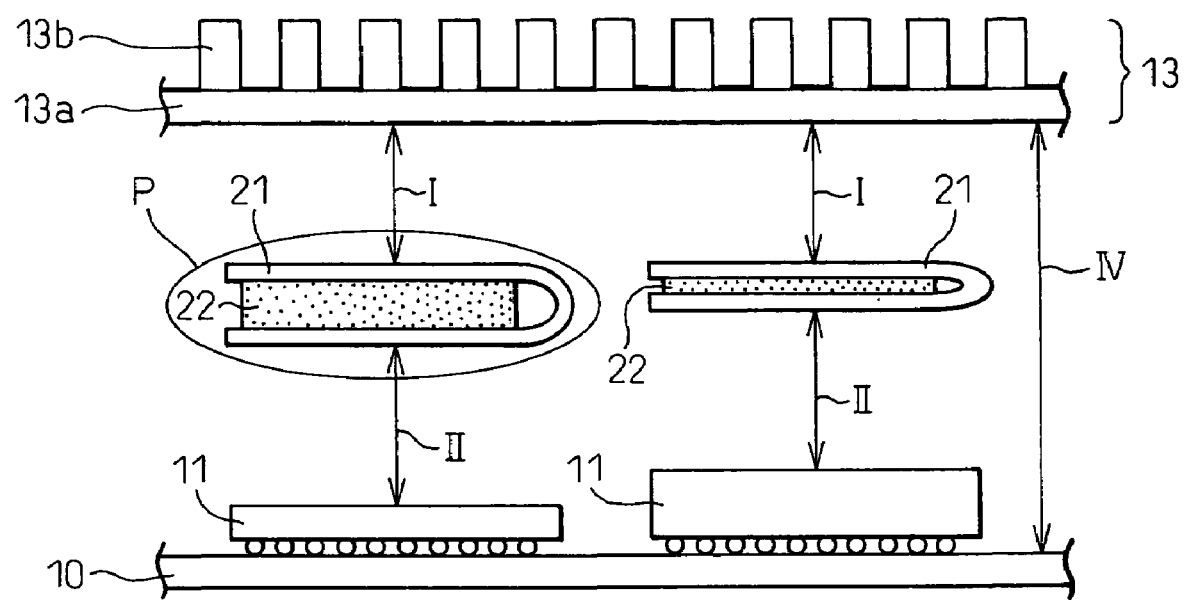
FIG. 4 is a view of the structure of FIG. 3 opened up in the vertical direction.
Figure 5:
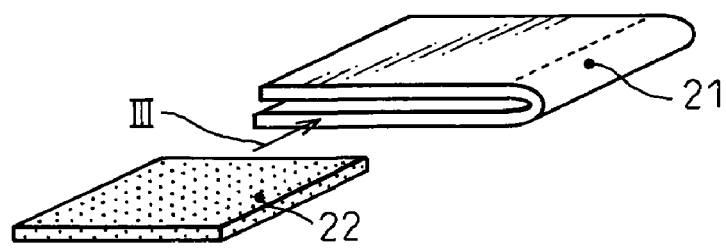
FIG. 5 is an opened up perspective view of the structure showing the inside of the circle P of FIG. 4.

FIG. 4 is a view of the structure of FIG. 3 opened up in the vertical direction, while FIG. 5 is an opened up perspective view of the structure shown inside the circle P of FIG. 4.

Referring to FIG. 4 and FIG. 5, the elastic members 22 are comprised of polymer-based members. The material suitable as the polymer-based members is for example a silicone rubber foam or a polyurethane foam.

Different parts are fixed together while sandwiching the elastic members 22 at the centers. That is, the parts for interconnecting the heat generating bodies 11, the film-shaped heat conductors 21, the elastic members 22, and the heat dissipating part 13 are tightly fixed by bonding members. These parts are the parts shown by I, II, and III in FIG. 4 and FIG. 5. Further, a look at the bonding members shows the following.

As the bonding member at each of the interconnecting parts I, for example, an adhesive with a good thermal conductivity is used. However, this is made an adhesive layer of a thickness of a negligible extent. Alternatively, for example, brazing, soldering, or another metal bond may be used.

Further, as the bonding member at each of the interconnecting parts II, for example, an adhesive with a good thermal conductivity (same as above I) is used. Alternatively, a sticky thin thermal conductive sheet (for example, silicone rubber sheet) is used. Due to this, no fine layer of air can be formed at the bonding surfaces.

Further, as the bonding member at each of the interconnecting parts III (FIG. 5), an ordinary adhesive can be used. In this case, one of the top and bottom surfaces of the elastic member 22 is coated with a suitable amount of an adhesive, then the member is inserted into and fixed to the U-shaped flexible heat pipe (21). Finally, the members (10, 11, 21, 22, 13) are clamped together and fixed at the interconnecting part IV (FIG. 4). This is shown in FIG. 6.

Figure 6:
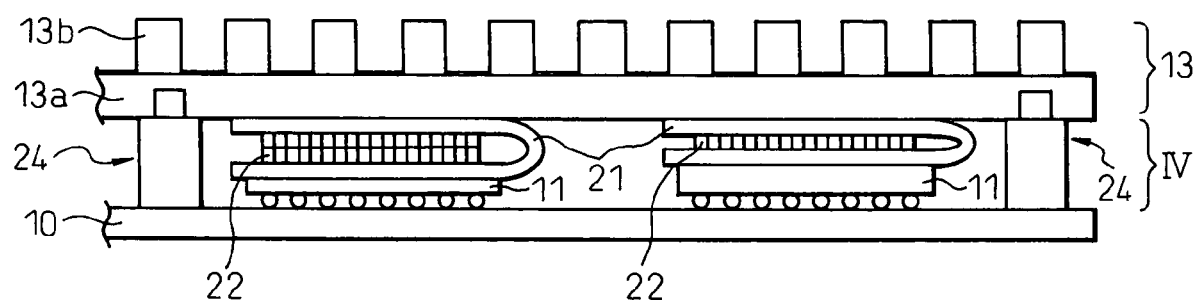
FIG. 6 is a view specifically showing the structure at an interconnecting part IV of FIG. 4.

FIG. 6 shows a specific example of the structure at the interconnecting part IV of FIG. 4.

This interconnecting part IV is configured by a tight fixing means 24 for clamping together the heat generating bodies 11, film-shaped heat conductors 21 (21', 31, 31'), and elastic members 22 between the board 10 mounting the heat generating bodies 11 and the heat diffusion plate 13a forming the heat dissipating part 13. The means 24 is for example comprised of spacer pipes. These are screwed (or riveted) to the board 10 and heat diffusion plate 13a.

Here, an example of the case of forming the parts shown in FIG. 4 by commercially available products will be explained.

First, as the "metal foil-type flexible heat pipe" forming each of the film-shaped heat conductors 21, "PERAFLEX" made by Furukawa Electric Co., Ltd. is suitable.

Next, as an adhesive with a good thermal conductivity at the interconnecting parts I and II, "Premium Silver Thermal Adhesive" made by Artic Silver is suitable.

The first embodiment explained with reference to FIG. 3 to FIG. 6 may be summarized as follows:

The heat transfer mechanism 12 according to the present embodiment is comprised of a mechanism for an electrical apparatus wherein heat generating bodies 11 mounted on a printed circuit board 10 and a heat dissipating part 13 are connected satisfying the requirements for compactness, high elasticity, and high thermal conductivity and without applying an excessive external stress on the heat generating bodies 11 by tightly fixing high elasticity and high heat conductivity members comprised of U-shaped flexible heat pipes 21 and elastic members 22 such as silicone rubber foam or polyurethane foam by an adhesive or a metal bond such as brazing or soldering to the heat dissipating part 13, and the heat dissipating part 13 and the printed circuit board 10 are tightly fixed with the heat generating bodies 11 by a tight fixing means 24 through an adhesive or sticky thin thermal conductive sheets, whereby the high elasticity and high heat conductivity members are clamped to the heat generating bodies 11.

Figure 7:
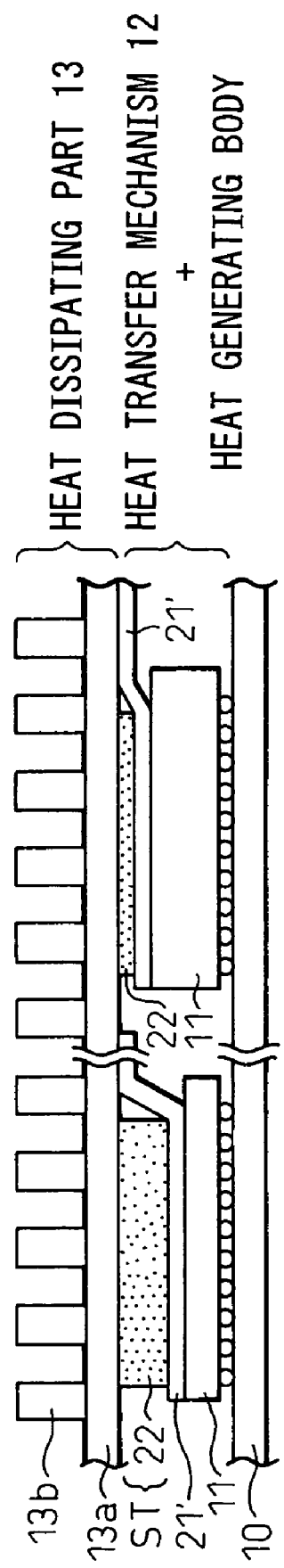
FIG. 7 is a view of a second embodiment according to the first basic configuration (FIG. 1) in cross-section.

FIG. 7 is a view of a second embodiment according to the first basic configuration (FIG. 1) in cross-section. According to the illustrated second embodiment, the above-mentioned film-shaped heat conductors 21 have step shapes in side cross-section (21') and transfer heat from the heat generating bodies 11 to the heat dissipating part 13 along the steps. Further, the elastic members 22 are provided at the step parts (see ST in FIG. 7).

The advantage of the second embodiment is that it is possible to satisfy the requirement of further reducing the space between the heat generating bodies 11 and the heat diffusion plate 13a. However, since the flexible heat pipes 21 inherently to be sandwiched between the top surfaces of the elastic members 22 and the bottom surface of the heat diffusion plate 13a (see FIG. 3) are extended in a direction far from the elastic members 22, the second embodiment is preferably applied to the case of a layout where adjoining heat generating bodies 11 can be placed sufficiently spaced apart, that is, to the case where the layout density of the heat generating bodies 11 is relatively small.

Figure 8:
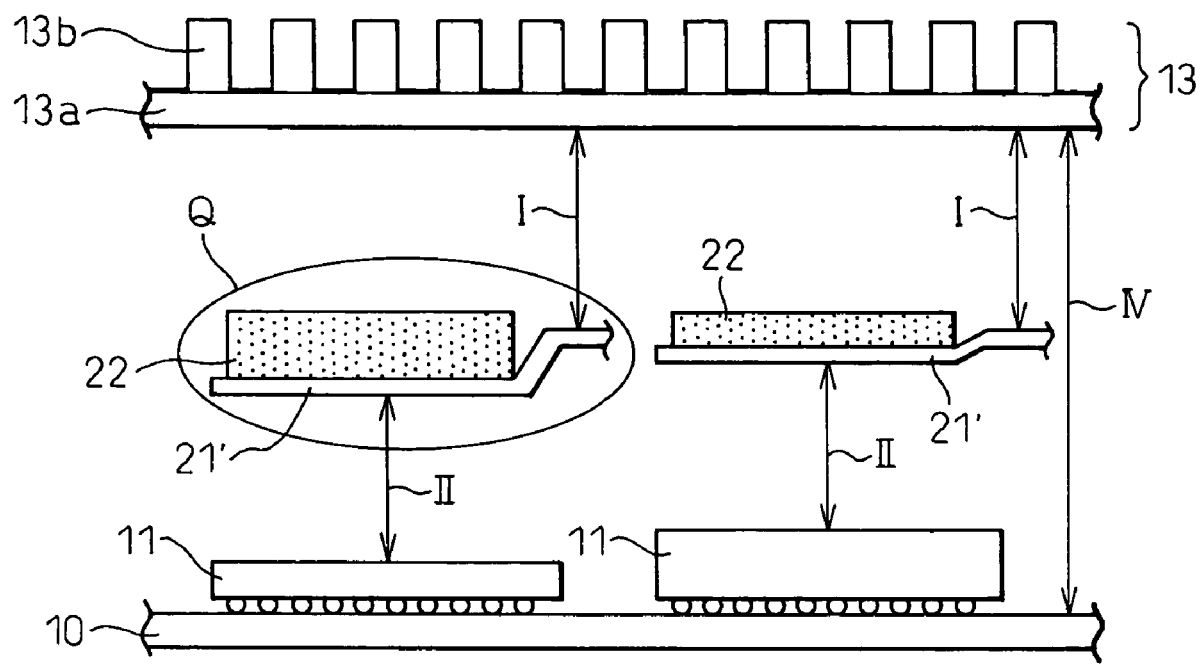
FIG. 8 is a view of the structure of FIG. 7 opened up in the vertical direction.
Figure 9:
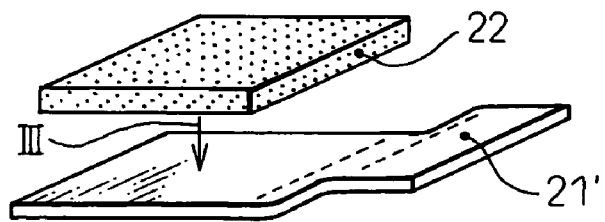
FIG. 9 is an opened up perspective view of the structure showing the inside of the circle Q of FIG. 8.

After FIG. 7, FIG. 8 is a view of the structure of FIG. 7 opened up in the vertical direction. FIG. 9 is an opened up perspective view of the structure inside the circle Q of FIG. 8. Except for the fact that the flexible heat pipe is changed from a U-shape (21) to a step shape (21'), the same explanation applies as in the above-mentioned FIG. 4 (=FIG. 8) and FIG. 5 (=FIG. 9).

The second embodiment shown in FIG. 7 to FIG. 9 may be summarized as follows.

The heat transfer mechanism 12 according to the present embodiment is comprised of the high flexibility heat transfer mechanism according to the first embodiment wherein the U-shaped flexible heat pipes 21 are made step shaped (21'), the bonding surfaces with the high elasticity and high heat conductivity members comprised of these and elastic members 22 such as silicone rubber foam or polyurethane foam are tightly fixed by an adhesive or a metal bond such as brazing or soldering to a heat dissipating part 13, and the heat dissipating part 13 and a printed circuit board 10 are tightly fixed to the heat generating bodies 11 by a tight fixing means 24 through an adhesive or sticky thin thermal conductive sheets, whereby the high elasticity and high heat conductivity members are clamped to the heat generating bodies 11.

Next, a first embodiment and second embodiment of the second basic configuration based on the present invention shown in FIG. 2 will be explained.

As explained in FIG. 2, the second basic configuration is characterized by the use of carbon-based thermal conductive sheets as the film-shaped heat conductors 31. More specifically, this takes the following two modes:

(i) The carbon-based thermal conductive sheets forming the film-shaped heat conductors 31 can be formed from graphite sheets or
(ii) The carbon-based thermal conductive sheets forming the film-shaped heat conductors 31 can be formed from carbon nanotube sheets.

By using the film-shaped members (i) or (ii), the space between the heat generating bodies 11 and the heat dissipating part 13 can be further narrowed.

Figure 10:
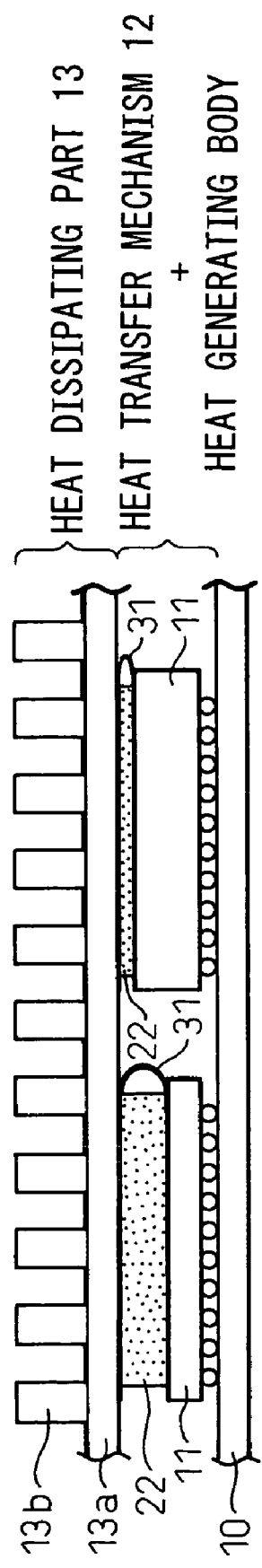
FIG. 10 is a view of a first embodiment according to the second basic configuration (FIG. 2) in cross-section.

FIG. 10 is a view of a first embodiment based on the second basic configuration (FIG. 2) in cross-section.

According to the first embodiment of this figure, each of the film-shaped heat conductors 31 forms a U-shape in side cross-section and transfers heat from the corresponding heat generating body 11 to the heat dissipating part 13 along the U-shape. Further, an elastic member 22 is inserted into this U-shape.

Figure 11:
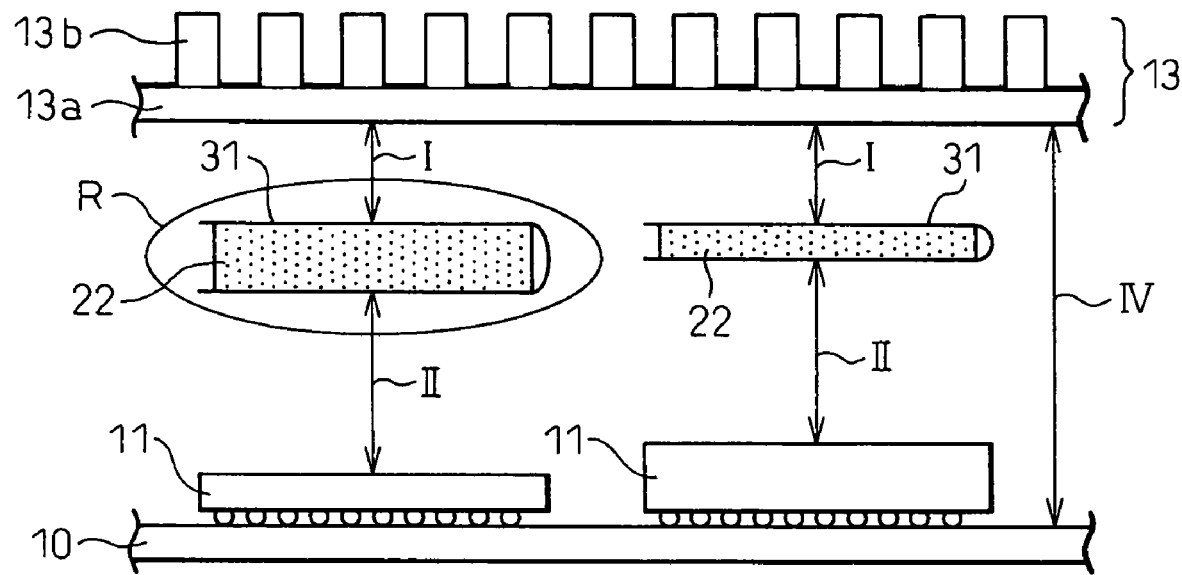
FIG. 11 is a view of the structure of FIG. 10 opened up in the vertical direction.
Figure 12:
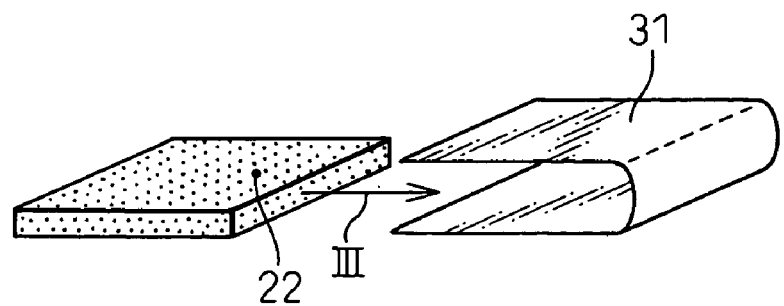
FIG. 12 is an opened up perspective view of the structure showing the inside of the circle R of FIG. 11.

After FIG. 10, FIG. 11 is a view of the structure of FIG. 10 opened up in the vertical direction, while FIG. 12 is an opened up perspective view of the structure showing the inside of the circle R of FIG. 11.

Referring to FIG. 11 and FIG. 12, the elastic members 22, as explained above, are comprised of polymer-based members. For example, they are silicone rubber foam or polyurethane foam.

Different parts are fixed together while sandwiching the elastic members 22 at the centers. That is, the parts for interconnecting the heat generating bodies 11, the film-shaped heat conductors 31, the elastic members 22, and the heat dissipating part 13 are tightly fixed by bonding members. These parts are the parts shown by I, II, and III in FIG. 11 and FIG. 12. Further, a look at the bonding members shows the following.

As the bonding member at each of the interconnecting parts I, for example, an adhesive with a good thermal conductivity is used. However, this is made an adhesive layer of a thickness of a negligible extent.

Further, as the bonding member at each of the interconnecting parts II, for example, an adhesive with a good thermal conductivity (same as above I) is used. Alternatively, a sticky thin thermal conductive sheet (for example, silicone rubber sheet) is used. Due to this, no fine layer of air can be formed at the bonding surfaces.

Further, as the bonding member at each of the interconnecting parts III (FIG. 12), an ordinary adhesive may be used. In this case, the top and bottom surfaces of the elastic member 22 are both coated with suitable amounts of an adhesive, then the member is inserted into and fixed to corresponding U-shaped thermal conductive sheet 31. Finally, at the interconnecting part IV (FIG. 1), the members (10, 11, 31, 22, and 13) are tightly fixed together. This is shown in FIG. 6.

FIG. 6 is a view specifically showing the structure at the interconnecting part IV of FIG. 11. This interconnecting part IV is configured by a tight fixing means 24 for clamping the heat generating bodies 11, film-shaped heat conductors 31, and elastic members 22 between the board 10 mounting the heat generating bodies 11 and the heat diffusion plate 13a forming the heat dissipating part 13. The means 24 is for example comprised of spacer pipes. These are screwed (or riveted) to the board 10 and heat diffusion plate 13a.

The first embodiment shown in FIG. 10 to FIG. 12 and FIG. 6 may be summarized as follows.

The heat transfer mechanism 12 according to the present embodiment comprises the high flexibility heat transfer mechanism shown in FIG. 3 to FIG. 5 wherein, instead of the U-shaped flexible heat pipes 21, graphite sheets or carbon nanotube sheets are similarly formed into U-shapes, the heat dissipating part 13 sides of high elasticity and high heat conductivity members comprised of these and elastic members 22 such as silicone rubber foam or polyurethane foam are tightly fixed by an adhesive to the heat dissipating part 13, and the heat dissipating part 13 and a printed circuit board 10 are tightly fixed to the heat generating bodies 11 by a tight fixing means 24 through an adhesive or sticky thin thermal conductive sheets (for example, silicone rubber sheets), whereby they are clamped to the heat generating bodies 11.

Figure 13:
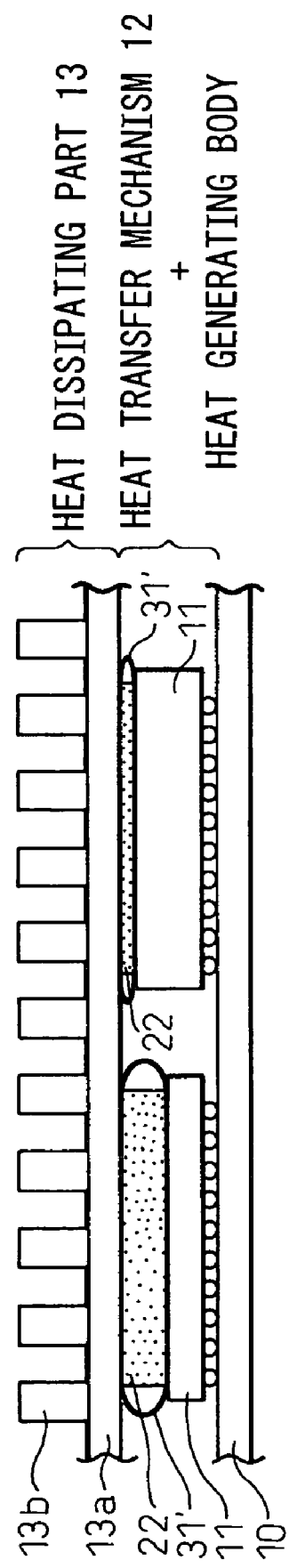
FIG. 13 is a view of a second embodiment according to the second basic configuration (FIG. 2) in cross-section.

FIG. 13 is a view of a second embodiment based on the second basic configuration (FIG. 2) in cross-section.

According to the second embodiment of this figure, each of the film-shaped heat conductors 31 is O-shaped in side cross-section (31') so as to completely enclose the corresponding elastic member 22 and is designed to transfer heat from the corresponding heat generating body 11 to the heat dissipating part 13 along this O-shape.

The advantage of the second embodiment is that the heat transfer property is raised about two-fold compared with the first embodiment of FIG. 10.

Figure 14:
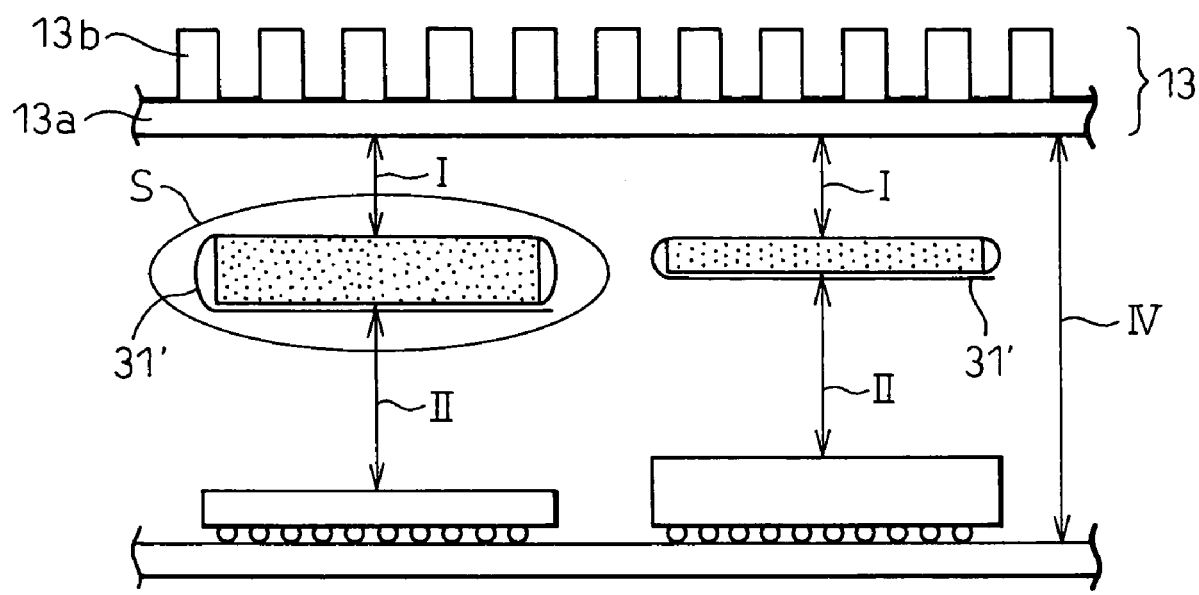
FIG. 14 is a view of the structure of FIG. 13 opened up in the vertical direction.
Figure 15:
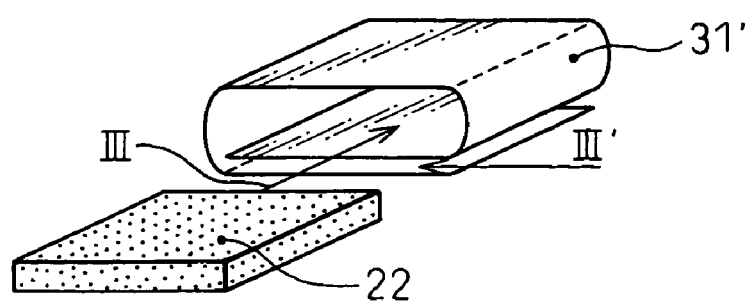
FIG. 15 is an opened up perspective view of the structure showing the inside of the circle S of FIG. 14.

After FIG. 13, FIG. 14 is a view of the structure of FIG. 13 opened up in the vertical direction, while FIG. 15 is an opened up perspective view of the structure showing the inside of the circle S of FIG. 14.

The explanation of the interconnecting parts I, II, III, and IV given with reference to FIG. 11 and FIG. 12 may be applied to the interconnecting parts I, II, III, and IV in FIG. 14 and FIG. 15 as well, but in FIG. 15 the interconnecting part III' is further shown. For this part III', it is preferable to use an adhesive suitable for tightly fixing together carbon-based thermal conductive sheets and having a good thermal conductivity.

Further, in the present embodiment as well, the tight fixing means 24 shown in FIG. 6 is applied. Due to this means 24, the heat generating bodies 11, the film-shaped heat conductors 31', and the elastic members 22 are clamped together between the board 10 mounting the heat generating bodies 11 and the heat diffusion plate 13a forming the heat dissipating part 13.

The second embodiment shown in FIG. 13 to FIG. 15 and FIG. 6 may be summarized as follows.

The heat transfer mechanism 12 according to this embodiment comprises the high flexibility heat transfer mechanism shown in FIG. 10 to FIG. 12 wherein graphite sheets or carbon nanotube sheets are formed into O-ring shapes (31'), the heat dissipating part 13 sides of high elasticity and high heat conductivity members comprised of these and elastic members 22 such as silicone rubber foam or polyurethane foam are tightly fixed by an adhesive to the heat dissipating part 13, and the heat dissipating part 13 and a printed circuit board 10 are tightly fixed to the heat generating bodies 11 by a tight fixing means 24 through an adhesive or sticky thin thermal conductive sheets (for example, silicone rubber sheets), whereby they are clamped to the heat generating bodies.

The examples of the present invention explained above and the already explained Related Art A to F are compared in Table 1. Further, the superiority of the present invention over the Related Art A to F is summarized as in A) to F) after Table 1.

TABLE 1

| Heat transfer mechanism | Component elements | Space in thickness direction required for elasticity of about 1 mm | General application field |
|---|---|---|---|
| First basic configuration of present invention | FLEX heat pipes + elastic members | 2 to 3 mm or more | PIU |
| Second basic configuration of present invention | Graphite sheets and CNT sheets + elastic members | 2 to 3 mm or more | PIU |
| Related Art A | Rubber sheets | 3 to 5 mm or more | PIU |
| Related Art B | Compound (grease) | 2 to 3 mm or more | PIU |
| Related Art C | Metal leaf springs | 2 to 3 mm or more | PIU, housing |
| Related Art D | Bellows | 10 mm or more | Large systems |
| Related Art E | Structure of metal mesh surrounded by thermal conductive sheet | 3 to 5 mm or more | PIU, housings |
| Related Art F | Existing plate-type heat pipes | 10 mm or more | Power appliances, vehicles, housings |

Note: FLEX: flexible tube, CNT: carbon nanotube, PIU: plug-in unit.

Superiority of Present Invention Compared with Related Arts A to F

A) A high heat transfer property can be realized and, at the same time, a high elasticity can be secured in a narrow space.

B) A high heat transfer property can be realized.

C) A high heat transfer property can be realized

D) A high elasticity can be secured in a narrow space and the structure is simple, so the cost can be suppressed.

E) A high heat transfer property can be realized and, at the same time, a high elasticity can be secured in a narrow space.

F) A high elasticity can be secured in a narrow space.

Above, the heat transfer mechanism 12 according to the present invention explained with reference to FIG. 1 to FIG. 15 can be sufficiently used even as a single part itself, but a plurality of these can be combined to construct a single heat dissipation system as well. This will be explained below.

Figure 16:
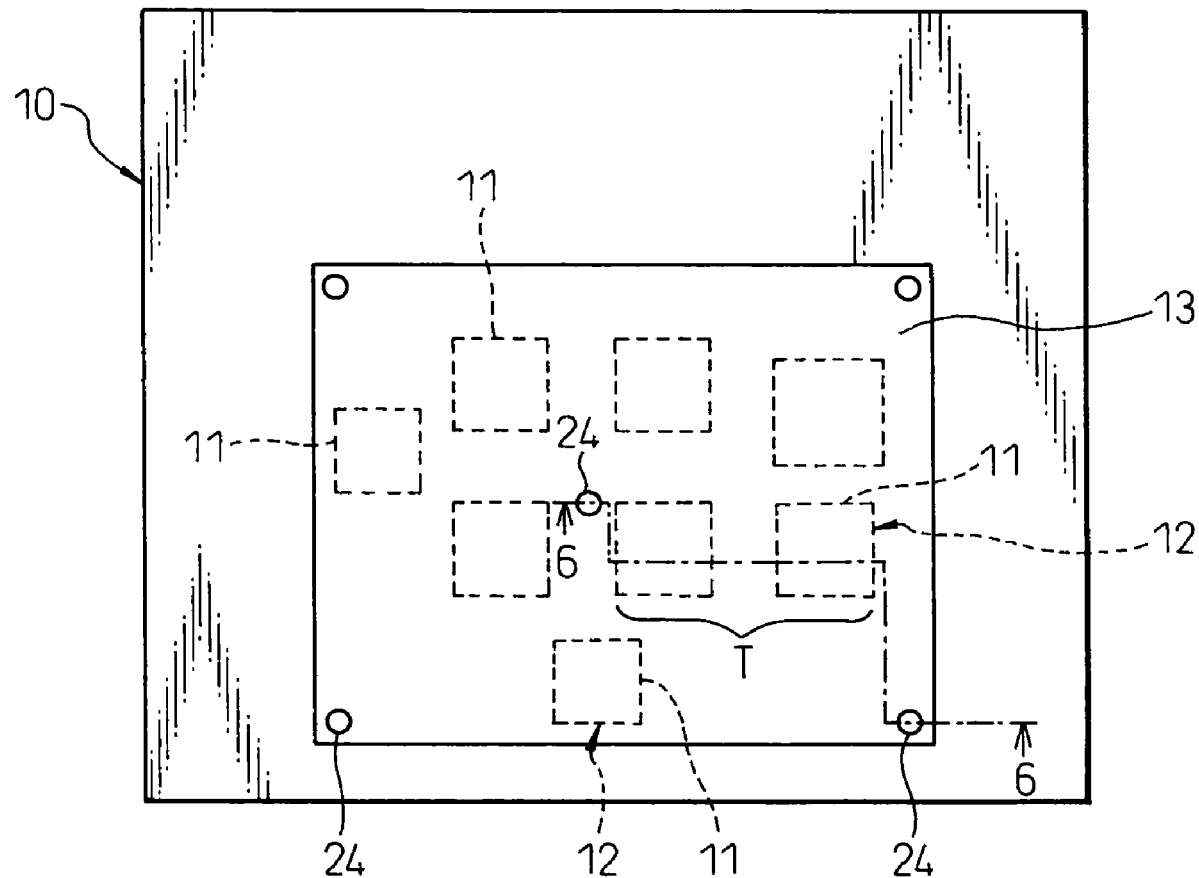
FIG. 16 is a top view of an example of a heat dissipation system according to the present invention.

FIG. 16 is a top view of an example of the heat dissipation system according to the present invention.

The heat dissipation system 41 shown in the figure is a heat dissipation system dissipating heat generated from heat generating bodies 11 (in the figure, eight illustrated) mounted on a common board (printed circuit board) 10 through a heat transfer mechanism 12 from a common heat dissipating part 13, wherein, in the case based on the first basic configuration (FIG. 1), the heat transfer mechanism 12 is comprised of, for each heat generating body 11, a film-shaped heat conductor 21 (21') transferring heat from a heat generating body 11 to the heat dissipating part 13 and an elastic member 22 for imparting elasticity to the film-shaped heat conductor, and the film-shaped heat conductor 21 (21') is formed from a metal foil type flexible heat pipe.

When the heat dissipation system 41 shown in the figure is based on the second basic configuration (FIG. 2), the heat transfer mechanism 12 is formed from, for each heat generating body 11, a film-shaped heat conductor 31 (31') for transferring heat from the heat generating body 11 to the heat dissipating part 13 and an elastic member 22 imparting elasticity to the film-shape heat conductor. Here, the film-shaped heat conductor 31 (31') is formed from a carbon-based thermal conductive sheet.

This figure is a top view of the heat dissipation system 41. Part of it is shown by for example the 6-6 cross-section and becomes as shown in FIG. 6 for example (case based on first basic configuration (FIG. 1)). Here, reference numeral 24 shows screws, rivets, or other tight fixing means. The heat dissipating fins 13b in the heat dissipating part 13 shown in FIG. 6, however, are not shown in FIG. 16. Only the top surface of the heat diffusion plate 13a is shown. If more powerful heat dissipation (cooling) is sought in the heat diffusion plate 13a, it is sufficient to incorporate ordinary heat pipes (not shown) at the heat dissipation part 13, in particular the heat diffusion plate 13a.

Note that the cross-sections in FIG. 3, FIG. 8, FIG. 10, and FIG. 13 already explained correspond to cross-sections at the region of T in the 6-6 cross-section in FIG. 15.

The heat dissipation system 41 shown in FIG. 16 can be suitably used for an apparatus requiring that a plurality of parts dissipating heat be cooled all together. A typical example is a communication apparatus.

Figure 17:
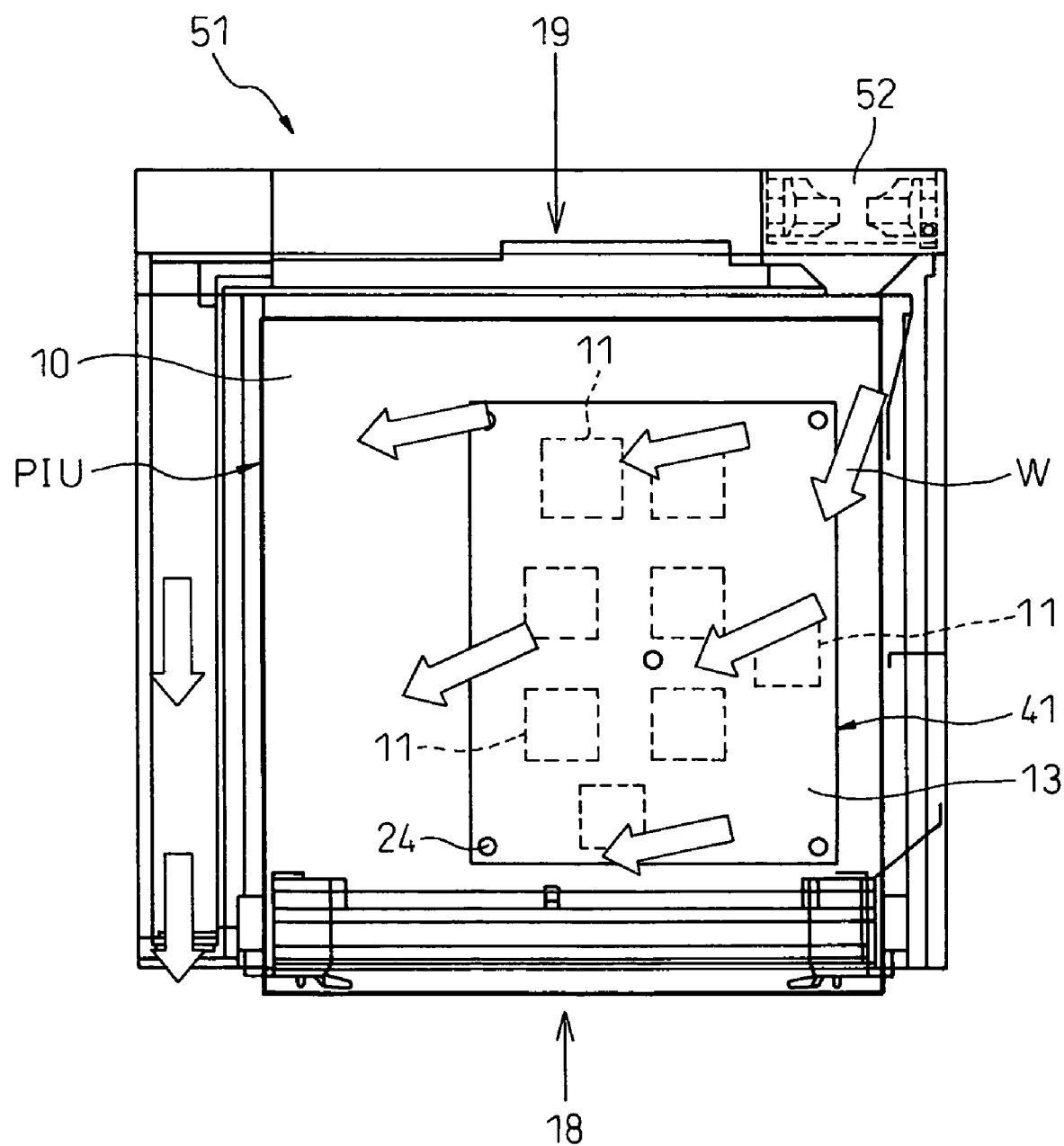
FIG. 17 is a top view of an example of a communication apparatus according to the present invention.

FIG. 17 is a top view of an example of a communication apparatus according to the present invention.

The communication apparatus 51 shown in this figure is a communication apparatus wherein the heat generating bodies 11 are IC packages and wherein the heat dissipation system 41 of the present invention dissipating heat from these heat generating bodies 11 is provided. This heat dissipation system 41 has the structure explained in FIG. 16. This heat dissipation system 41 dissipates heat by blowing air from the fan 52 in the direction of the arrows W. Due to this, the IC packages (11) are cooled. Note that FIG. 16 shows a single PIU, but in actually a plurality of PIUs are stacked together to form a single communication apparatus 51. This state is clear from FIG. 18.

Figure 18:
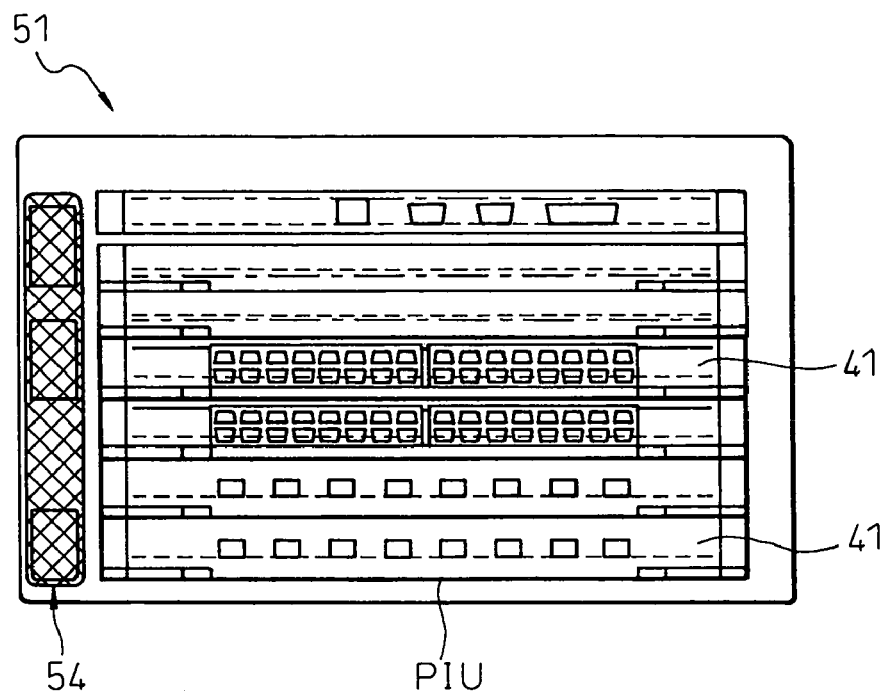
FIG. 18 is a front view along the arrow 18 of FIG. 17.

FIG. 18 is a front view along the arrow 18 of FIG. 17 and shows an example of seven PIUs stacked together and each PIU contains many heat generating bodies (IC packages) with high density. Among the seven PIUs, the heat dissipation systems 41 according to the present invention are applied to the first through fourth from the bottom. In FIG. 18, however, only the connectors with the LAN cable, optical fiber, telephone cord, etc. are shown. The heat dissipation system 41 present in back of the connectors cannot be seen.

Figure 19:
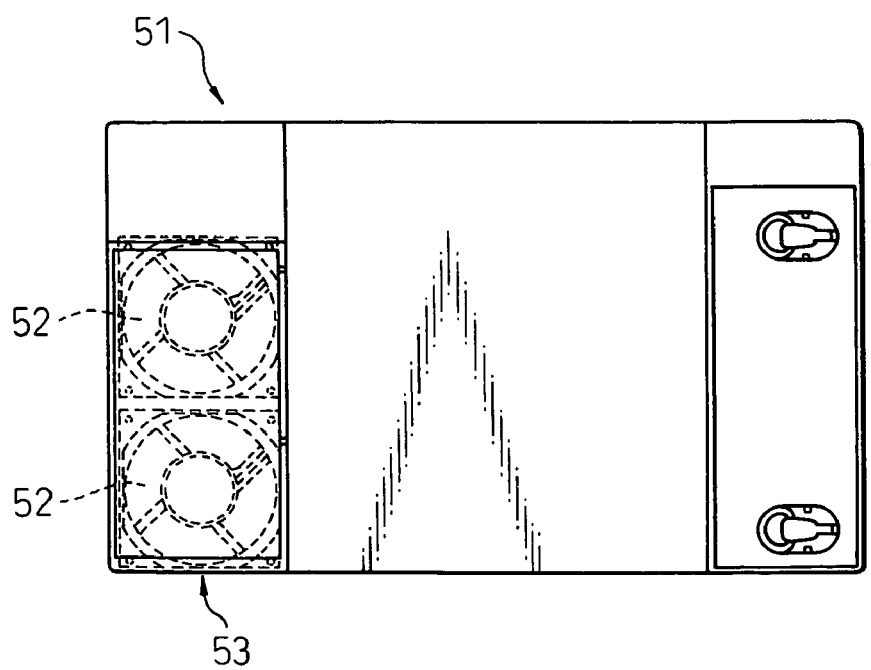
FIG. 19 is a back view along the arrow 19 of FIG. 17.

FIG. 19 is a back view along the arrow 19 of FIG. 17 and is the so-called power source view. Reference numeral 53 shows an intake port provided with a fan 52 shown in FIG. 17. The air taken in here is exhausted from the exhaust port 54 shown in FIG. 18. Due to this, the direction W shown in FIG. 17 is obtained.

According to the present invention, a heat dissipation system able to dissipate heat generated from various heat generating bodies carried on a single board with a high efficiency for cooling and can suitably be applied to a communication apparatus for dissipating heat generated from various IC packages mounted on a single printed circuit board with a high efficiency for cooling.

While the invention has been described with reference to specific embodiments chosen for purpose of illustration, it should be apparent that numerous modifications could be made thereto by those skilled in the art without departing from the basic concept and scope of the invention.

What is claimed is:

1. A heat transfer mechanism for dissipating heat from a heat generating body to a heat dissipating part, the heat generating body being directly coupled, at its bottom surface, to a common board, comprising:
   a film-shaped heat conductor for transferring heat from a top surface of the heat generating body to the heat dissipating part; and
   an elastic member directly coupled, at its upper surface, with said heat dissipating part and, at its lower surface, with said film-shaped heat conductor, the length of the elastic member being shorter than the length of the top surface of said heat generating body, for imparting elasticity to the film-shaped heat conductor,
   said film-shaped heat conductor being formed from a metal foil-type flexible heat pipe,
   wherein said film-shaped heat conductor has a double bent shape of an upper leg and a lower leg arranged in parallel with each other and connected by a middle leg that offsets the upper and lower legs with obtuse angles and transfers heat from the top surface of the heat generating body to the heat dissipating part along the double bent heat conductor by sandwiching the lower leg of said double bent heat conductor between said heat generating body and said elastic member so that said lower leg of said double bent heat conductor makes direct contact with substantially an entire top surface of said heat generating body, and coupling the upper leg of said double bent heat conductor directly to said heat dissipating part by extending said upper leg of said double bent heat conductor beyond an end portion of said heat generating body.

2. The heat transfer mechanism as set forth in claim 1 wherein said elastic member is comprised of a polymer-based member.

3. The heat transfer mechanism as set forth in claim 1 wherein bonding members are used for interconnecting said heat generating body, said film-shaped heat conductor, said elastic member, and said heat dissipating part.

4. The heat transfer mechanism as set forth in claim 1, further provided with tight fixing means for clamping said heat generating body, said film-shaped heat conductor, and said elastic member between a board mounting said heat generating body and a heat diffusion plate forming said heat dissipating part.

5. A heat dissipation system dissipating heat generated from heat generating bodies mounted, at their bottom surfaces, on a common board through a heat transfer mechanism to a common heat dissipating part, wherein:
   said heat transfer mechanism comprises, for each heat generating body, a film-shaped heat conductor transferring heat from a top surface of a heat generating body to said heat dissipating part and an elastic member directly coupled with said heat dissipating part, the length of the elastic member being shorter than the length of the surface of said heat generating body, for imparting elasticity to said film-shaped heat conductor,
   said film-shaped heat conductor is formed from a metal foil-type flexible heat pipe, and
   said film-shaped heat conductor has a double bent shape of an upper leg and a lower leg arranged in parallel with each other and connected by a middle leg that offsets the upper and lower legs with obtuse angles and transfers heat from the top surface of the heat generating body to the heat dissipating part along the double bent heat conductor by sandwiching the lower leg of said double bent heat conductor between said heat generating body and said elastic member so that said lower leg of said double bent heat conductor makes direct contact with substantially an entire top surface of said heat generating body, and coupling directly the upper leg of said double bent heat conductor to said heat dissipating part, by extending said upper leg of said double bent heat conductor beyond an end portion of said heat generating body.

6. A communication apparatus provided with heat generating bodies constituted by IC packages and with a heat dissipation system as set forth in claim 5 for dissipating heat from said heat generating bodies.

* * * * *